United States Patent [19]

Busby

[11] Patent Number: 4,652,695
[45] Date of Patent: Mar. 24, 1987

[54] MESH-COVERED CORE STRIP FOR HIGH FREQUENCY RFI/EMI RADIATION SHIELDING

[75] Inventor: Robert B. Busby, Pawling, N.Y.

[73] Assignee: Pawling Corporation, Pawling, N.Y.

[21] Appl. No.: 712,280

[22] Filed: Mar. 15, 1985

Related U.S. Application Data

[63] Continuation-in-part of Ser. No. 506,010, Jun. 20, 1983, abandoned.

[51] Int. Cl.$^4$ .............................................. H05K 9/00
[52] U.S. Cl. ................................................ 174/35 GC
[58] Field of Search ........... 174/35 GC; 219/10.55 D; 49/488

[56] References Cited

U.S. PATENT DOCUMENTS

| | | | |
|---|---|---|---|
| 2,898,648 | 8/1959 | Bright | 49/488 X |
| 3,026,367 | 3/1962 | Hartwell | 174/35 GC |
| 3,214,879 | 11/1965 | Ellingson, Jr. et al. | 49/488 X |
| 3,413,406 | 11/1968 | Plummer | 174/35 GC X |

FOREIGN PATENT DOCUMENTS

| | | | |
|---|---|---|---|
| 958482 | 2/1957 | Fed. Rep. of Germany | 174/35 GC |
| 2112259 | 7/1983 | United Kingdom | 219/10.55 D |

*Primary Examiner*—A. C. Prescott
*Assistant Examiner*—D. A. Tone
*Attorney, Agent, or Firm*—Mandeville and Schweitzer

[57] ABSTRACT

A high frequency RFI/EMI shielding strip is disclosed which comprises a strip of two-layer circular knit metal mesh material, which is folded around the exterior of a resilient core element. Projecting edge margins of the conductive mesh material are gripped and clamped by a continuously extending flange structure, forming an integral part of a continuous clip element. The structure eliminates the necessity for knitting the conductive mesh material in-situ about the resilient core. Exceptional cost savings result, without compromise in shielding performance.

7 Claims, 5 Drawing Figures

MESH-COVERED CORE STRIP FOR HIGH FREQUENCY RFI/EMI RADIATION SHIELDING

RELATED APPLICATIONS

This application is closely related to and constitutes a continuation-in-part of my copending Application Ser. No. 506,010, filed June 20, 1983 now abandoned.

BACKGROUND AND SUMMARY OF THE INVENTION

Operation of conventional computer equipment, for example, is typically accompanied by the generation of radio frequency and/or electromagnetic radiation in the electronic circuitry of the computer system. If not properly shielded, such radiation can cause considerable interference with entirely unrelated equipment. Accordingly, governmental regulations, as well as sound manufacturing practice dictate that the sources of radio frequency and/or electromagnetic radiation within the computer system be effectively shielded and grounded.

In instances where the radiation-generating circuitry is permanently or semipermanently housed in a container, effective shielding may be accomplished easily through proper construction of the enclosure structure. In certain cases, however, effective RF interference (RFI) or electromagnetic interference (EMI) shielding present somewhat more difficult problems. This is particularly true, for example, where the equipment housing is provided with a readily openable access panel or door, for servicing or other routine access. In addition, large numbers of computer installations have been made in the past without a full understanding of the effect of partially unshielded enclosures, particularly involving access doors. Accordingly, many manufacturers and/or users of older computer equipment are attempting to uprade the level of RFI/EMI shielding through retrofit installation of shielding devices around the access openings. To this end, it has been known heretofore to provide a clip-on shielding device adapted to be pressed or clipped onto an exposed sheet metal edge, typically provided at the peripheral edges of an access door of a conventional sheet metal housing or enclosure for a computer installation. A device of known construction includes a continuous, roll-formed strip metal clip, to one side surface of which has been bonded a resilient tubular element of electrically conductive elastomer. The clip is constructed so as to be appliable over the edge of sheet metal door or panel and retained in place by frictional gripping action of the roll-formed clip. The configuration of the element is such that the resilient tubular elastomer, bonded to the clip, is brought into contact with a fixed surface of the enclosure, when the door or panel is closed, effectively sealing off the narrow gap otherwise typically provided between a door or panel and the oppositely facing surface areas of the housing.

The improved device of my before mentioned prior application Ser. No. 506,010, includes a specially designed continuous metal strip to which is bonded a strip of resilient, conductive elastomer. This device represented a substantial advance in the trade, in providing for high performance shielding with a strip that can be manufactured at reasonable cost and, importantly, which is easily installed, either as part of the initial manufacturing operations or as part of a retrofit installation.

As manufacturers of computer equipment have introduced newer designs, operating at higher and higher frequencies, however, the conductivity of electrically conductive elastomeric tubing, used in the known shielding strips, becomes marginally effective for adequate attenuation of the high frequency spectrum of the radiation. Accordingly, where such higher radiation frequencies are involved, it is becoming more necessary to utilize conductive mesh materials, supported internally by an elastomeric core or similar element, to provide an adequate level of radiation shielding. Radiation shielding strips made for this purpose are known to the trade. However, the manufacturing processes involved in their production are complex and expensive, such that the end product, as installed in the shielded housing, represents a substantial expense.

In the manufacture of conventional mesh shielded strips, for example, a tubular sleeve of conductive wire is knitted in the form of continuous tube closely about the exterior of a resilient core. Typically, this operation is performed twice, once to provide a tightly conforming inner mesh and a second time to provide an outer tubular mesh. Both tubes surround and are supported internally by the resilient core. The thus-shielded core is secured to continuous mounting strip means or the like, for mounting upon the housing to be shielded. Typically, this is done by providing sufficient slack in the outer mesh layer to enable a "tail flange" to be formed of the excess material, which can be secured in some form to mounting means.

While the prior art material described above performs adequately, it is extremely costly. For example, a typical such shielded tubing may sell for as much as 80 cents per foot, for the shielded core alone, without any kind of mounting means.

In accordance with the present invention, a novel and greatly improved construction is provided for mesh shielded resilient core material, which enables this material to be provided to the trade at a small fraction of the cost of conventional material. Pursuant to the invention, a conventional tubular knitted mesh material is formed of a conductive metal wire. The mesh material is not, however, knitted around the core material, but rather is knitted in a conventional manner and gathered in roll form, for example, as flat, double-layered tubular material. Pursuant to the invention, the overall width of the two-layered tubular material is somewhat in excess of the circumference of the resilient core material. This enables the two-layered mesh to be wrapped widthwise around the entire circumference of the core material, leaving the respective opposite side edge margins of the mesh material extending laterally outward from the core. These extending margins are tightly clamped between opposed flanges of a continuous metallic strip, which is advantageously shaped and configured to serve as a mounting clip on the structure to be shielded.

A strip constructed in accordance with the present invention, may be made available to the trade at great cost reduction, without any compromise whatever in the performance of the strip.

For a more complete understanding of the above and other features and advantages of the invention, reference should be made to the following detailed description of a preferred embodiment of the invention, and to the accompanying drawings.

DESCRIPTION OF THE DRAWINGS

FIG. 1 is a simplified perspective illustration of a typical cabinet with access door, for housing computer circuitry or the like.

DESCRIPTION OF A PREFERRED EMBODIMENT

Figure 1:
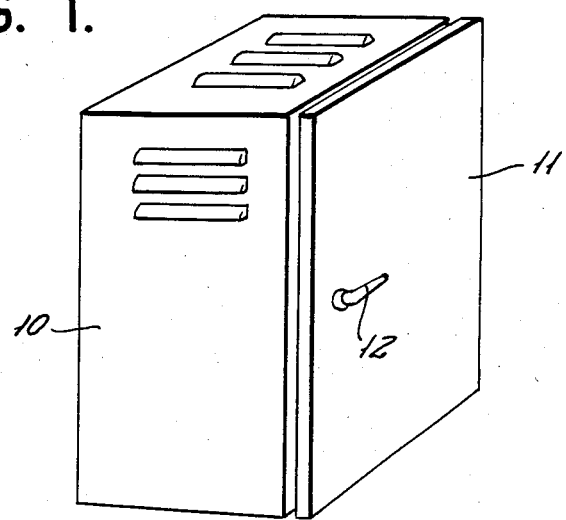
Figure 2:
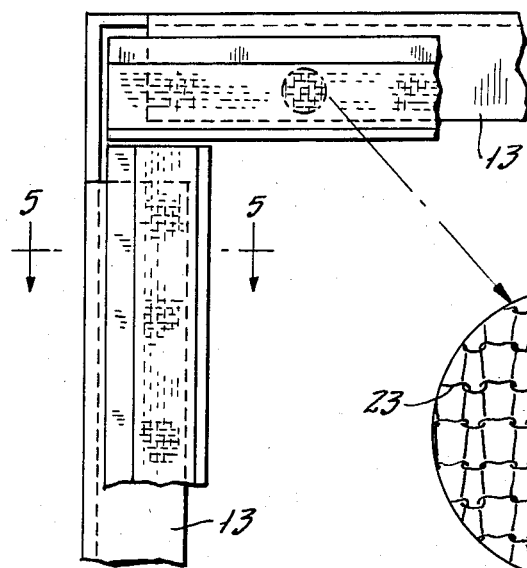
FIG. 2 is an enlarged, fragmentary view, partly in section, showing sections of the new shielding strip mounted in the cabinet of FIG. 1.
Figure 3:
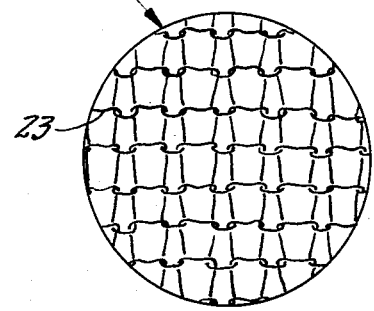
FIG. 3 is a highly enlarged view of a selected area of FIG. 2, illustrating details of the knitted metallic mesh material which forms a conductive shield.

Referring now to the drawing, the reference numeral 10 designates a typical metallic housing utilized for computer circuitry and the like. The housing is typically provided with an access door 11 having a locking handle 12 on one side and provided with a suitable hinge means (not shown) on the opposite side. For effective RFI/EMI radiation shielding, the interface between the housing proper 10 and the door 11 is provided about its entire periphery with a resilient strip of shielding material. The arrangement is such that, when the access door 11 is closed, the resilient shielding strip will be contacted and compressed about the entire periphery of the door to provide good electrical contact all around.

As described in my copending application Ser. No. 506,010, the shielding strip, advantageously is formed in part by a continuous sheet metal strip, formed to provide a continuous clip-shaped cross section adapted for edgewise application over a peripheral flange section 13 provided around the edges of the door and/or housing.

The continuous clip element, designated generally by the reference numeral 14, advantageously is formed of stainless steel strip, approximately 0.020 inch thick. This can be shaped by continuous roll-forming techniques into a generally U-shaped clip form having an overall width of about 0.5 to 0.6 inches, for example. The upper portion of the continuous clip if formed by a generally flat upper flange 15 arranged in its assembled position to lie along the outer face of the housing or door flange 13. The clip is generously rounded at the closed end 16, which joins with a lower flange section 17.

Figure 5:
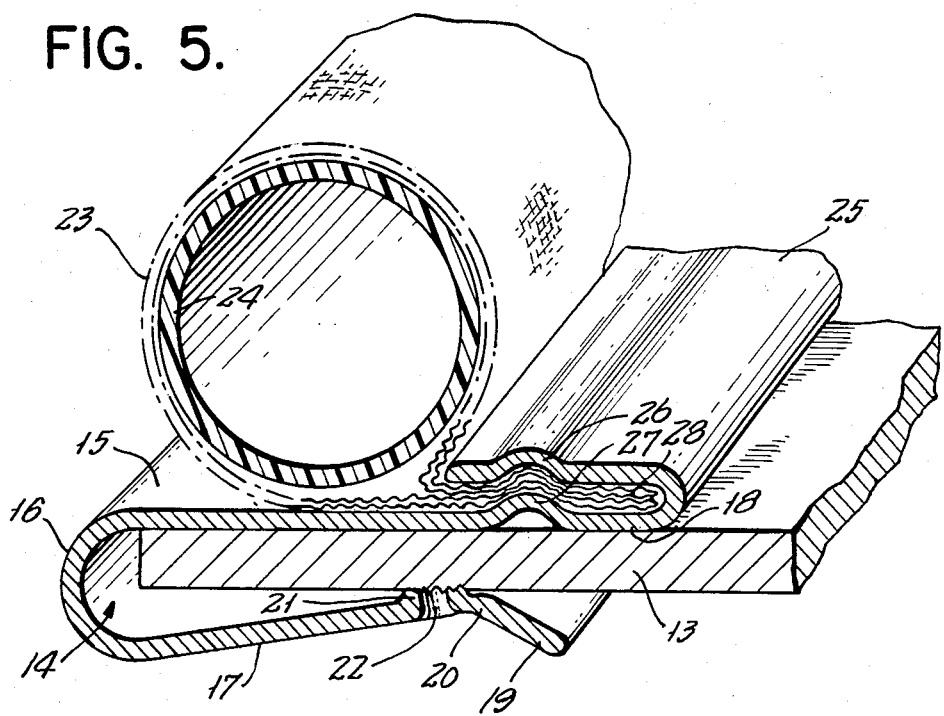
FIG. 5 is a perspective view, in cross section, of the shielding strip of the invention, as mounted on a housing or the like, the section being substantially as taken on line 5—5 of FIG. 2.

As evident in FIG. 5, the overall width of the upper flange 15 is somewhat greater than that of the lower flange 17, providing a projecting margin 18 of the upper flange which serves as an important guide element, and greatly facilitates the mounting of an elongated length of strip material upon the edge of a housing or door flange 13.

At its outer edge, the lower flange 17 is formed with an outwardly diverging guide section 19, which defines a narrow portion or throat 20 of the clip-like cross section. Adjacent and slightly toward the closed end of the clip from the throat 20, the strip is through-punched, providing a circular configuration of jagged grounding prongs 21. Advantageously, these grounding prongs are punched into the strip at about two inch centers. Their function is to scratch through any paint or other coating that may be on the facing surface of the housing flange 13, in order to assure good electrical grounding contact of the metallic strip material.

In a typical strip configuration used in the structure of the invention, the guide flange 19 may be located approximately 0.1 inch back of the edge extremity of the upper guide flange portion 18, and the lower guide flange 19 may be disposed at an angle of, for example, 30° to the upper flange 17. The throat area 20 typically may be located approximately 0.1 inch behind the edge extremity of the lower guide flange 19, and the center of the punched-through area 22 typically may be located approximately 0.150 inch behind the edge of the flange 19. The jagged grounding prongs 21 may project from the principal plane of the flange 17 a distance of, for example, about 0.025 inch.

The clip-like strip, as thus far described, is substantially in accordance with my copending application Ser. No. 506,010. In the construction illustrated in the earlier application, there is bonded to the upper flange 15 a conductive elastomeric material which provides electrical contact with the grounding strip. In the structure of the present invention, however, a conductive metallic knitted mesh material 23 provides the conductive shielding, and a tubular elastomeric core 24 serves primarily as a resilient support for the conductive mesh material. For a typical application, the tubular core 24 may be a tubing of about 0.25 OD and about 0.15 ID, formed of a nonconductive silicone material. Conductive elastomer may, of course, be utilized if desired, but the extra cost of such material may not be justified.

Figure 4:
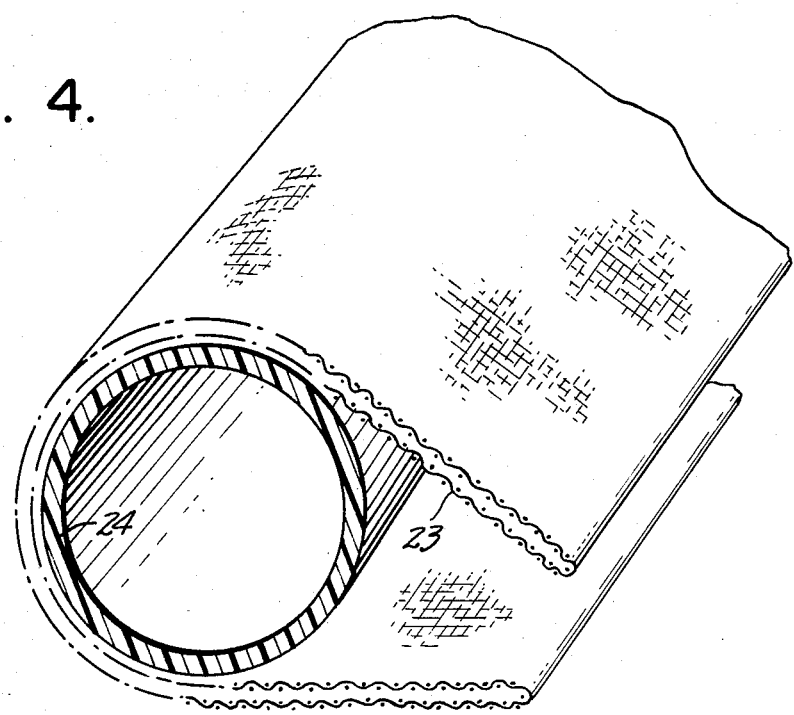
FIG. 4 is a perspective view, partly in section, illustrating a shielding strip according to the invention in a preliminary stage of manufacture.

Pursuant to an important aspect of the invention, a conductive knitted mesh material, in the form of a generally conventional circular knitted tube, is wrapped about the resilient tubular core 24, initially in the manner indicated in FIG. 4. For a clip of the typical dimensions previously indicated, the tubular mesh material may be knitted of a soft monel wire of, for example, 0.0045 inch diameter to form a knitted tube having a circumference of approximately 2.50 inches. When flattened to two-layered form, the width of the knitted metallic tubing is approximately 1.25 inches.

As reflected in FIG. 5, the upper flange of the clip element is provided with a reverse folded clamping flange 25, which overlies the end portion of the upper flange 15 and extends back toward the resilient core member 24. Both the clamping flange 25, and the portion of the upper flange lying directly underneath it are provided with offset indentations 26, 27 for crimping and gripping a projecting margin or tail 28 of the mesh material.

In the manufacture of the illustrated shielding strip, the core material 24, with the two-layered mesh material folded over it, as shown in FIG. 4, is fed continuously together with a partially formed clip element, in which the clamping flange 25 remains partially open. The "tail" portion 28 of the mesh material is continuously inserted into the open pocket underneath the clamping flange 25, after which the flange is rolled to a tightly closed position, tightly gripping the four layers of mesh material and, in addition, applying a tight crimp at the crimping offsets 26, 27.

The structure of the invention enables a mesh covered shielding strip to be manufactured on a highly expeditious, mass production basis, which enables the strip to be provided to the trade at a small fraction of the cost of strips made in the conventional ways. The procedure of the invention completely eliminates the heretofore costly but necessary procedure of knitting the tubular conductive metal mesh material about the core in an in-situ process, not only once, but twice in order to provide two layers of conductive mesh material. By the procedure of the invention, in contrast, a single tube of mesh material is knitted independently of the core material and later wrapped around the core material in flattened, two-layered form. Although the tubular core is not completely enveloped within the tubular conductive mesh material, there is no loss of performance in the shielding material, because the free ends of the mesh material are clamped tightly together in a closed-end, continuously folded flange structure of the clip device.

It should be understood, of course, that the specific form of the invention herein illustrated and described is intended to be representative only, as certain changes may be made therein within departing from the clear teachings of the disclosure. Accordingly, reference should be made to the following appended claims in determining the full scope of the invention.

I claim:

1. An RFI/EMI shielding strip for electronic cabinets and the like, which comprises
    (a) a continuous metal strip of clip-like cross section and of great length in relation to its width,
    (b) said strip being adapted to frictionally engage the edge of a cabinet panel,
    (c) a continuous core strip of resilient material extending along one side of said metal strip,
    (d) a flattened, two-layer strip of circular knitted metallic mesh material extending along said core strip and wrapped around and enveloping said core strip,
    (e) the width of the mesh strip being greater than the circumference of said core strip, and the opposite side edge margins of said two-layer mesh strip being brought together in face-to-face relation in four superposed layers, and
    (f) means for securing said side edge margins to said continuous metal strip.

2. An RFI/EMI shielding strip according to claim 1, further characterized by
    (a) said metal strip having an upper section adapted in the installed position of said strip to overlie a flange of the cabinet panel,
    (b) said core strip and enveloping mesh strip being supported upon said upper section,
    (c) the respective edge margins of said mesh strip being brought together in flat overlying relation upon and being secured to an edge portion of said upper section.

3. An RFI/EMI shielding strip according to claim 2, further characterized by
    (a) said metal strip having an integral edge flange folded over upon said edge portion,
    (b) said edge flange serving to clamp and secure the side edge margins of said mesh strip.

4. An RFI/EMI shielding strip according to claim 3, further characterized by
    (a) said edge flange and an underlying portion of said edge portion being formed with complementary, lengthwise-extending indentations for crimping marginal portions of said mesh strip.

5. An RFI/EMI shielding strip according to claim 1, further characterized by
    (a) said mesh strip comprising a circular knitted mesh of monel wire of about 0.0045 inch diameter,
    (b) said knitted mesh being flattened to two-layered strip form befire being applied about said core strip.

6. An RFI/EMI shielding strip for electronic cabinets and the like, which comprises
    (a) a continuous metal strip of clip-like cross section and of great length in relation to its width,
    (b) said strip being adapted to frictionally engage the edge of a cabinet panel,
    (c) a continuous core strip of resilient material extending along one side of said metal strip,
    (d) a flattened, two-layer strip of knitted metallic mesh material extending along said core strip and wrapped around and enveloping said core strip,
    (e) the width of the mesh strip being greater than the circumference of said core strip, and the opposite side edge margins of said mesh strip being brought together in face-to-face relation, and
    (f) means for securing said side edge margins to said continuous metal strip,
    (g) said clip-like strip having upper and lower sections joined along one side to form a closed side and having an open side,
    (h) said upper section extending beyond said lower section end forming a guide flange for installation,
    (i) the outer extremity of said lower section diverging from the upper section toward said open side and forming a narrow throat section at its convergent side,
    (j) a punched-through grounding prong region in said lower section located slightly beyond said throat section toward said closed side.

7. An RFI/EMI shielding strip according to claim 6, further characterized by
    (a) a folded over flange portion of said upper section engaging and gripping the edge margins of said mesh strip for enclosing and mounting said core strip.

* * * * *